United States Patent
Choi et al.

(10) Patent No.: US 7,149,131 B2
(45) Date of Patent: Dec. 12, 2006

(54) SEMICONDUCTOR MEMORY DEVICE AND INTERNAL VOLTAGE GENERATING METHOD THEREOF

(75) Inventors: Jun-Gi Choi, Ichon (KR); Yong-Kyu Kim, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 150 days.

(21) Appl. No.: 11/024,969

(22) Filed: Dec. 30, 2004

(65) Prior Publication Data

US 2006/0092743 A1 May 4, 2006

(30) Foreign Application Priority Data

Oct. 30, 2004 (KR) ............... 10-2004-0087674

(51) Int. Cl.
*G11C 5/14* (2006.01)
*G11C 11/4074* (2006.01)
*G11C 11/4076* (2006.01)

(52) U.S. Cl. ............ 365/189.09; 365/226; 365/227; 365/233

(58) Field of Classification Search ........... 365/203, 365/226, 227, 233, 189.09, 230.06
See application file for complete search history.

(56) References Cited

U.S. PATENT DOCUMENTS

| 5,287,320 | A | * | 2/1994 | Adachi ............... 365/226 |
| 5,814,851 | A | * | 9/1998 | Suh .................. 257/296 |
| 5,875,145 | A | | 2/1999 | Yamasaki et al. |
| 6,046,954 | A | * | 4/2000 | Yoon et al. ........... 365/226 |
| 6,150,860 | A | * | 11/2000 | Chun ................. 327/198 |
| 6,510,096 | B1 | * | 1/2003 | Choi et al. ........... 365/226 |
| 6,529,437 | B1 | | 3/2003 | Kono |
| 2001/0010457 | A1 | * | 8/2001 | Kobayashi et al. ..... 323/266 |
| 2002/0176305 | A1 | | 11/2002 | Kono |
| 2005/0024911 | A1 | * | 2/2005 | Kim ................... 365/100 |

FOREIGN PATENT DOCUMENTS

| JP | 08-147998 | 6/1996 |
| JP | 2002-326791 A | 11/2002 |
| KR | 2003-0072506 A | 9/2003 |

* cited by examiner

*Primary Examiner*—J. H. Hur
(74) *Attorney, Agent, or Firm*—McDermott Will & Emery LLP

(57) ABSTRACT

A semiconductor memory device reduces power consumption with maintaining quality of an internal power voltage and a core voltage. The semiconductor memory device reduces power consumption with sufficiently maintaining a core voltage during precharge. The semiconductor memory device includes a command decoder receiving external control signals to output an active signal and a precharge signal, an internal power voltage generation controlling unit receiving the active signal and the precharge signal for activating an internal power voltage active signal for a predetermined time, a core voltage generation controlling unit receiving the active signal, the precharge signal and the internal power voltage active signal for activating a core voltage active signal for a predetermined time, an internal power voltage generating unit for generating an internal power voltage during the activation period of the internal power voltage active signal; and a core voltage generating unit for generating a core voltage during the activation period of the core voltage active signal.

20 Claims, 10 Drawing Sheets

SEMICONDUCTOR MEMORY DEVICE AND INTERNAL VOLTAGE GENERATING METHOD THEREOF

FIELD OF INVENTION

The present invention relates to a semiconductor memory device; and, more particularly, to a semiconductor memory device including an internal voltage generating circuit for reducing power consumption and an internal voltage generating method.

DESCRIPTION OF PRIOR ART

A semiconductor memory device includes circuit blocks for performing respective functions, to which a predetermined level of an internal power voltage is supplied as a driving voltage of each of the circuit blocks depending on requirement such as reference potential supply.

Initially, an external power supply voltage VDD that is inputted to the device is directly used as the driving voltage. Recently, in the trend of low voltage environment, another approach is widely used, in which an internal power voltage VPP is generated by raising the level of the external power supply voltage VDD and the respective circuit blocks in the device are provided with the internal power voltage VPP.

Further, in the semiconductor device having MOS transistors, because a switching signal voltage that is inputted to a gate of a CMOS transistor is higher than a source voltage, which consumes power, by a threshold voltage, there should be various voltage levels to be supplied within the device. Particularly, for a DRAM semiconductor memory device in which each memory cell includes a cell MOS transistor and a cell capacitor coupled to the source of the cell MOS transistor, a core voltage VCORE that is a voltage when the cell capacitor is charged should be different from the internal power voltage VPP. However, cell capacitor charge is a frequent operation, which is a basic operation of the memory device and, therefore, a charge voltage generating unit for supplying the core voltage VCORE consumes power as much as the internal power voltage generating unit.

Accordingly, in order to reduce power consumption, it is needed to stop the operations of the internal power voltage generating unit and the core voltage generating unit while the circuit blocks that receive the corresponding voltages are not to be driven.

FIG. 1 shows a conventional internal voltage generating circuit implemented for addressing such a requirement. Referring to FIG. 1, an internal power voltage generating unit and a core voltage generating unit include respective active voltage generating units 50, 70, respective standby voltage generating units 60, 80, and a voltage generation controlling unit 40 for controlling drive of the active voltage generating units 50, 70.

External control signals such as CAS (Column Address Strobe), RAS (Row Address Strobe), CS (Chip Select), WE (Write Enable) are inputted to a command decoder 20 in the semiconductor memory device.

The command decoder 20 generates a row active pulse RACTP and a row precharge pulse RPCGP depending on the inputted control signals to output: to the requiring circuit blocks in the device, such as the voltage generation controlling unit 40. The voltage generation controlling unit 40 receives the row active pulse RACTP and the row precharge pulse RPCGP to generate a voltage generation active signal ACT for controlling the active internal power voltage generating unit 50 and the active core voltage generating unit 70.

FIG. 2 is a timing diagram of generation of the active signal ACT in the voltage generation controlling unit 40.

When the combination of the external control signals is analyzed as an ACT command, the row active pulse RACTP is generated. The rising of the row active pulse RACTP controls the voltage generation controlling unit 40 to activate the voltage generation active signal ACT.

After activation of the row active pulse RACTP, a RAS delay (not shown) outputs a RAS delay signal TRASBP that falls after a predetermined delay. The falling of the RAS delay signal TRASBP means deactivation of all the operations that are activated with the row active pulse RACTP. For stable operation, the voltage generation controlling unit 40 deactivates the voltage generation active signal ACT with a predetermined delay after it receives low transition of the RAS delay signal TRASBP.

The voltage generation controlling unit 40 activates the voltage generation active signal ACT at the rising of the row precharge pulse RPCGP and deactivates the voltage generation active signal ACT after a predetermined delay.

As described above, the voltage generation controlling unit 40 activates the voltage generation active signal ACT for a predetermined time after generation of the row active pulse RACTP and for a predetermined time after generation of the row precharge pulse RACGP. As such, power consumption of the active voltage generating units 50, 70 is reduced by adjusting driving time of the active internal power voltage generating unit 50 and the active core voltage generating unit 70.

However, the conventional technique described above has some problems.

First, since the internal power voltage generating unit for raising the external power voltage has its own voltage detector for checking condition for raising the voltage, it is not necessary to turn off the device during the driven row active pulse and row precharge pulse. The quality of the internal power voltage can be deteriorated when the device is turned off as such.

Second, it is required more time to supply the core voltage than the internal power voltage in the precharge. Therefore, in the conventional technique in which the internal power voltage generating unit and the core voltage generating unit are controlled with one signal, the internal power voltage can be generated for too long time while the core voltage can be generated for too short time.

SUMMARY OF INVENTION

It is, therefore, an object of the present invention to provide a semiconductor memory device for capable of reducing power consumption with maintaining quality of an internal power voltage and a core voltage, and an internal voltage generating method thereof.

It is another object of the present invention to provide a semiconductor memory device for capable of reducing power consumption with sufficiently maintaining a core voltage during precharge, and an internal voltage generating method thereof.

In accordance with an aspect of the present invention, there is provided a semiconductor memory device including a command decoder receiving external control signals to output an active signal and a precharge signal; and an internal voltage generating unit for generating an internal power voltage and a core voltage by using the active signal and the precharge signal, the activation timing of the internal power voltage being different from the activation timing of the core voltage.

In accordance with another aspect of the present invention, there is provided a semiconductor memory device including a command decoder receiving external control signals to output an active signal and a precharge signal; a first internal voltage generation controlling unit receiving the active signal and the precharge signal for activating a first internal voltage active signal for a predetermined time; a second internal voltage generation controlling unit receiving the active signal, the precharge signal and the first internal voltage active signal for activating a second internal voltage active signal for a predetermined time; a first internal voltage generating unit for generating a first internal voltage during the activation period of the first internal voltage active signal; and a second internal voltage generating unit for generating a second internal voltage during the activation period of the second internal voltage active signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor memory device including an internal voltage generating circuit in accordance with the present invention will be described in detail referring to the accompanying drawings.

Figure 1:
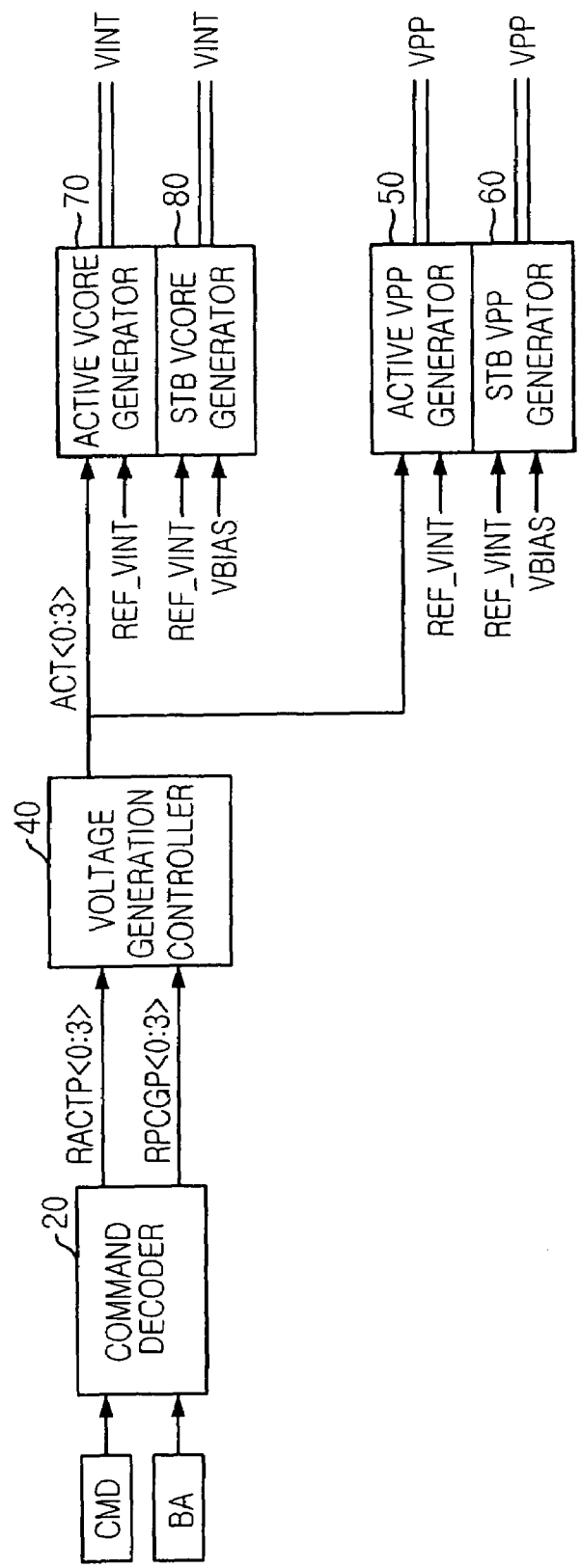
FIG. 1 is a block diagram showing a conventional internal voltage generating circuit.
Figure 2:
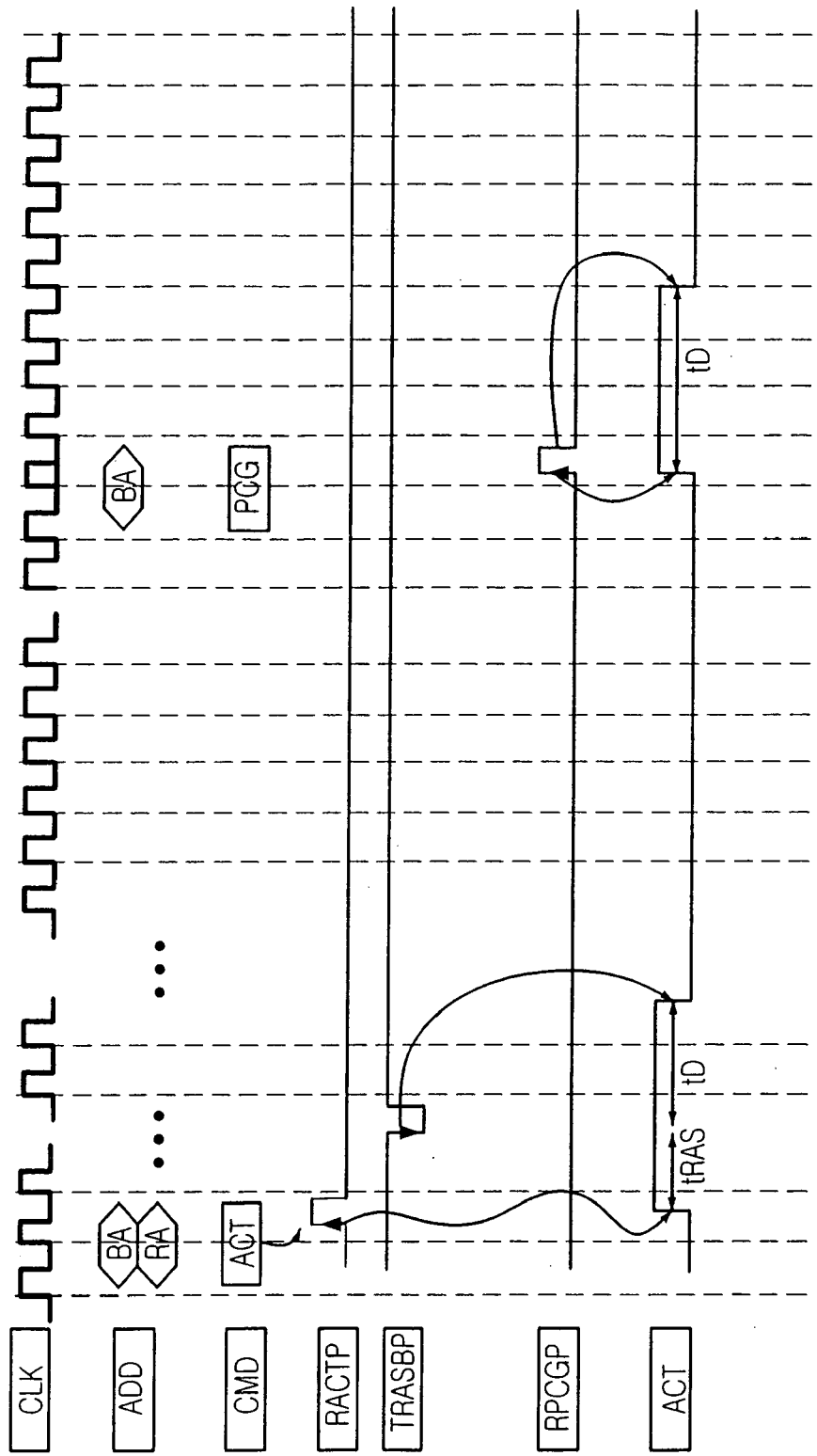
FIG. 2 is a timing diagram of respective signals used in an internal voltage generating circuit shown in FIG. 1.
Figure 3:
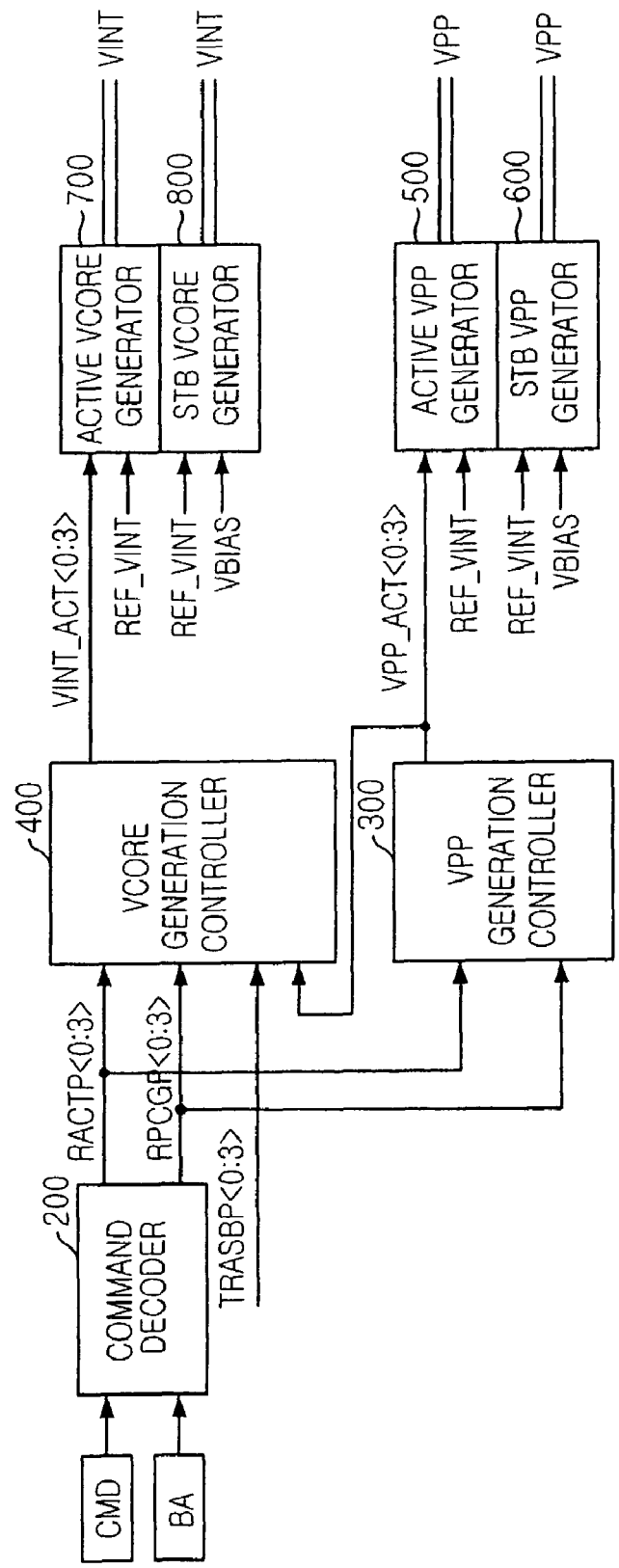
FIG. 3 is a block diagram showing an internal voltage generating circuit in accordance with the present invention.

Referring to FIG. 3, a semiconductor memory device in accordance with an embodiment of the present invention includes a command decoder 200 receiving external control signals to output a row active signal RACTP and a row precharge signal RPCGP, an internal power voltage generation controlling unit 300 receiving the row active signal RACTP and the row precharge signal RPCGP for activating an internal power voltage active signal VPP_ACT for a predetermined time, a core voltage generation controlling unit 400 receiving the row active signal RACTP, the row precharge signal RPCGP and the internal power voltage active signal VPP_ACT for activating a core voltage active signal VINT_ACT for a predetermined time, an internal power voltage generating unit 500 for generating an internal power voltage VPP during the activation period of the internal power voltage active signal VPP_ACT, and a core voltage generating unit 700 for generating a core voltage VINT during the activation period of the core voltage active signal VINT_ACT.

The command decoder 200 determines an external command from the combination of the external control signals. When the combination is determined as an active command ACT for a read or write operation, the command decoder 200 generates the row active pulse RACTP as an active signal for notifying the determination to elements within a memory bank. When the combination is determined as a precharge command PCG, the command decoder 200 generates the row precharge pulse RACGP as a precharge signal for notifying the determination to the elements within the memory bank. A RAS signal controlling unit (not shown) receiving the row active pulse RACTP generates a RAS delay signal TRASBP that is activated to low after a predetermined delay, sufficient for operation of the memory bank according to the active command ACT, from activation of the row active pulse RACTP.

Figure 4:
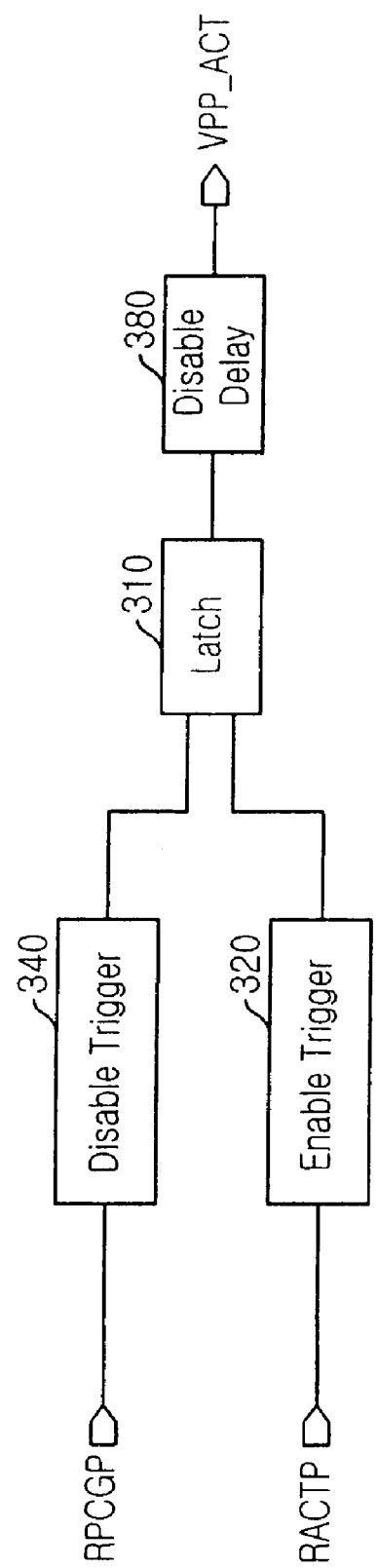
FIG. 4 is a detailed block diagram showing an internal power voltage generation controlling unit included in an internal voltage generating circuit shown in FIG. 3.

Referring to FIG. 4, the internal power voltage generation controlling unit 300 includes an enable trigger 320 receiving the row active signal RACTP for transiting the internal power voltage active signal VPP_ACT to activated state, a disable trigger 340 receiving the row precharge signal RACTP for transiting the internal power voltage active signal VPP_ACT to deactivated state, and a latching/delaying unit 360, 380 for delaying the results of the enable trigger 320 or the disable trigger 340 by a predetermined time to output the power internal voltage active signal VPP_ACT.

Figure 5:
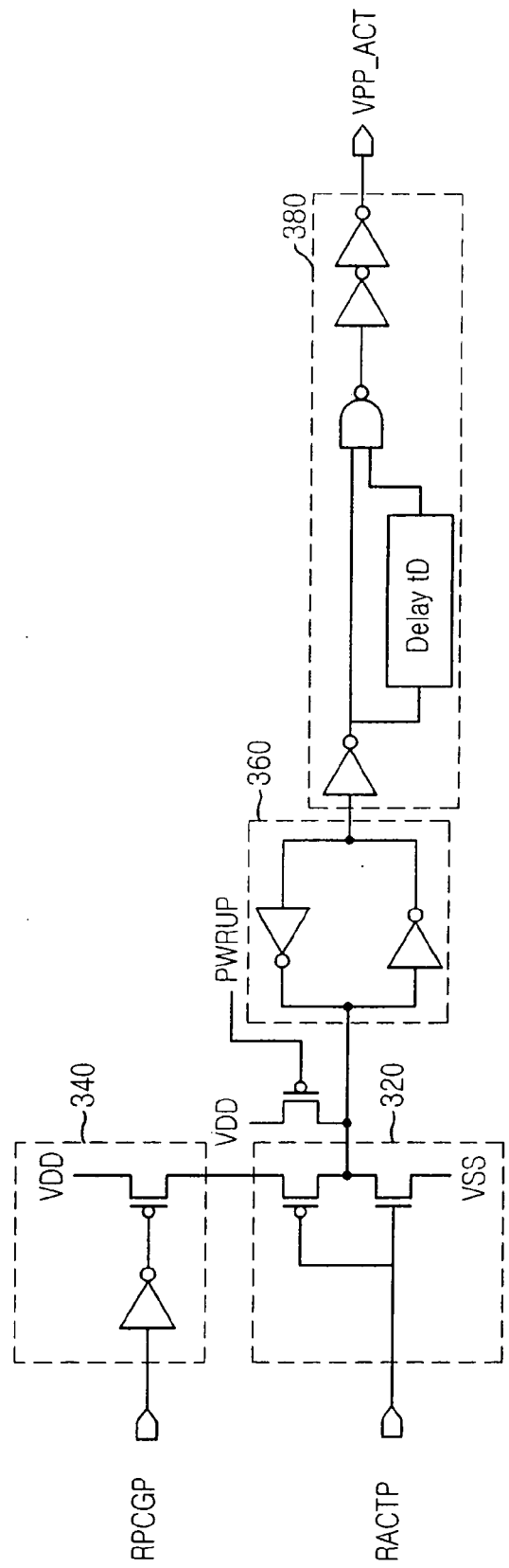
FIG. 5 is a detailed circuit diagram showing an internal power voltage generation controlling unit shown in FIG. 4.

Referring to FIG. 5, the disable trigger 340 may be formed with a switch for connecting the enable trigger 320 to the high voltage VDD when the row precharge pulse RACTP is high. The switch according to one embodiment may be implemented with an inverter and a PMOS transistor. The enable trigger 320 may be formed with two MOS transistors coupled to each other in the form of an inverter, having sources coupled to a low voltage VSS and the output of the disable trigger 340, respectively. Further, the latching/delaying unit 360, 380 is formed with a latching unit 360 having two inverters receiving the output of the enable trigger 320, and a delaying unit 380 having several inverters and/or several NAND gates for delaying the output of the latching unit 360.

Figure 6:
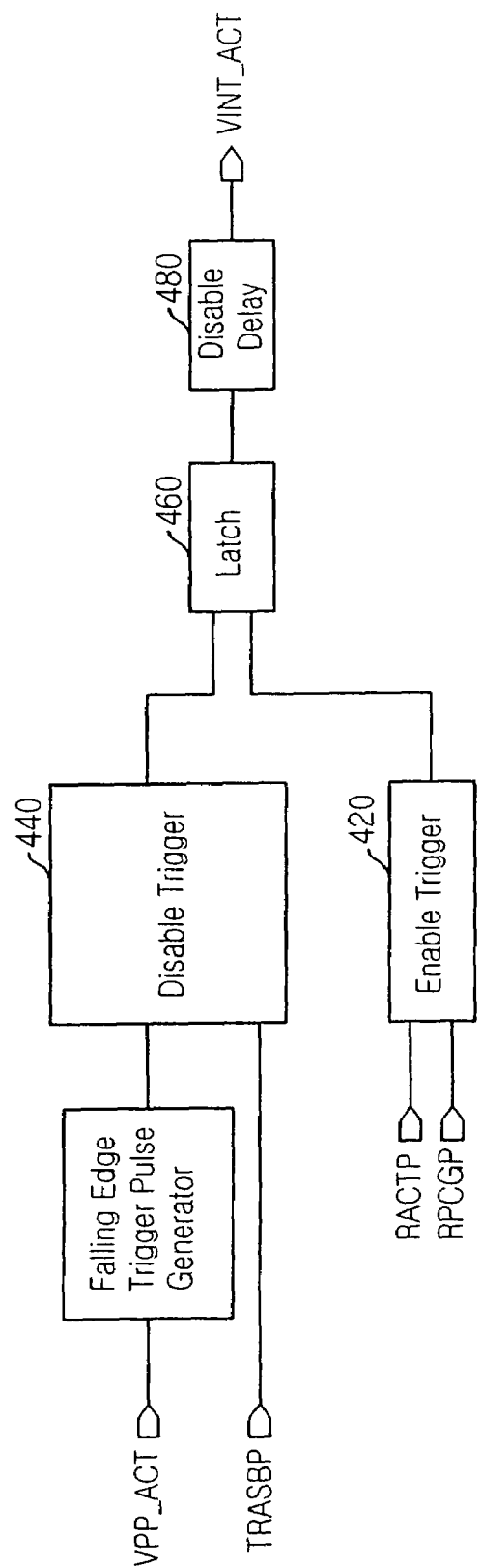
FIG. 6 is a detailed block diagram showing a core voltage generation controlling unit included in an internal voltage generating circuit shown in FIG. 3.

Referring to FIG. 6, the core voltage generation controlling unit 400 includes an enable trigger 420 receiving the row active pulse RACTP and the row precharge pulse RACGP for transiting the core voltage active signal VINT_ACT to activated state, a disable trigger 440 receiving the internal power voltage active signal VPP_ACT and the RAS delay signal TRASBP for transiting the core voltage active signal VINT_ACT to deactivated state, and a latching/delaying unit 460, 480 for delaying the results of the enable trigger 420 or the disable trigger 440 by a predetermined time to output the core voltage active signal VINT_ACT.

Figure 7:
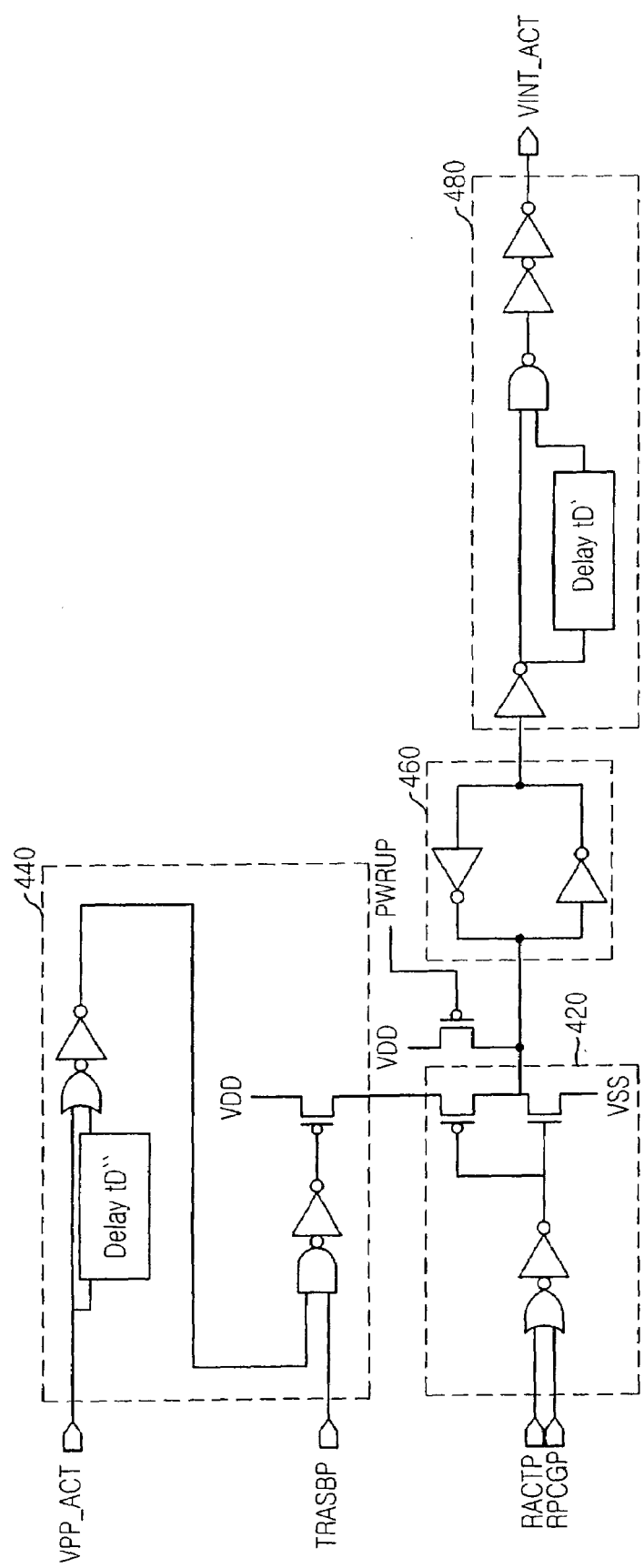
FIG. 7 is a detailed circuit diagram showing a core voltage generation controlling unit shown in FIG. 6.

As shown in FIG. 7, the disable trigger 440 includes a falling pulse delay for delaying the falling timing of the internal power voltage active signal VPP_ACT, an AND gate receiving the internal power voltage active signal VPP_ACT from the falling pulse delay and the RAS delay signal TRASBP, and a MOS transistor switch switched by the output of the AND gate. The falling pulse delay may be formed with a typical delay and an OR gate receiving the signal that passes through the typical delay and the signal that does not pass through the typical delay. The enable trigger 420 includes an OR gate receiving the internal power voltage active signal VPP_ACT and the RAS delay signal TRASBP, and two MOS transistors coupled to each other in the form of an inverter receiving the output of the OR gate. The latching/delaying unit 460, 480 may be implemented in the same structure as the latching/delaying unit 350, 380 of the internal power voltage generation controlling unit 300.

Figure 8:
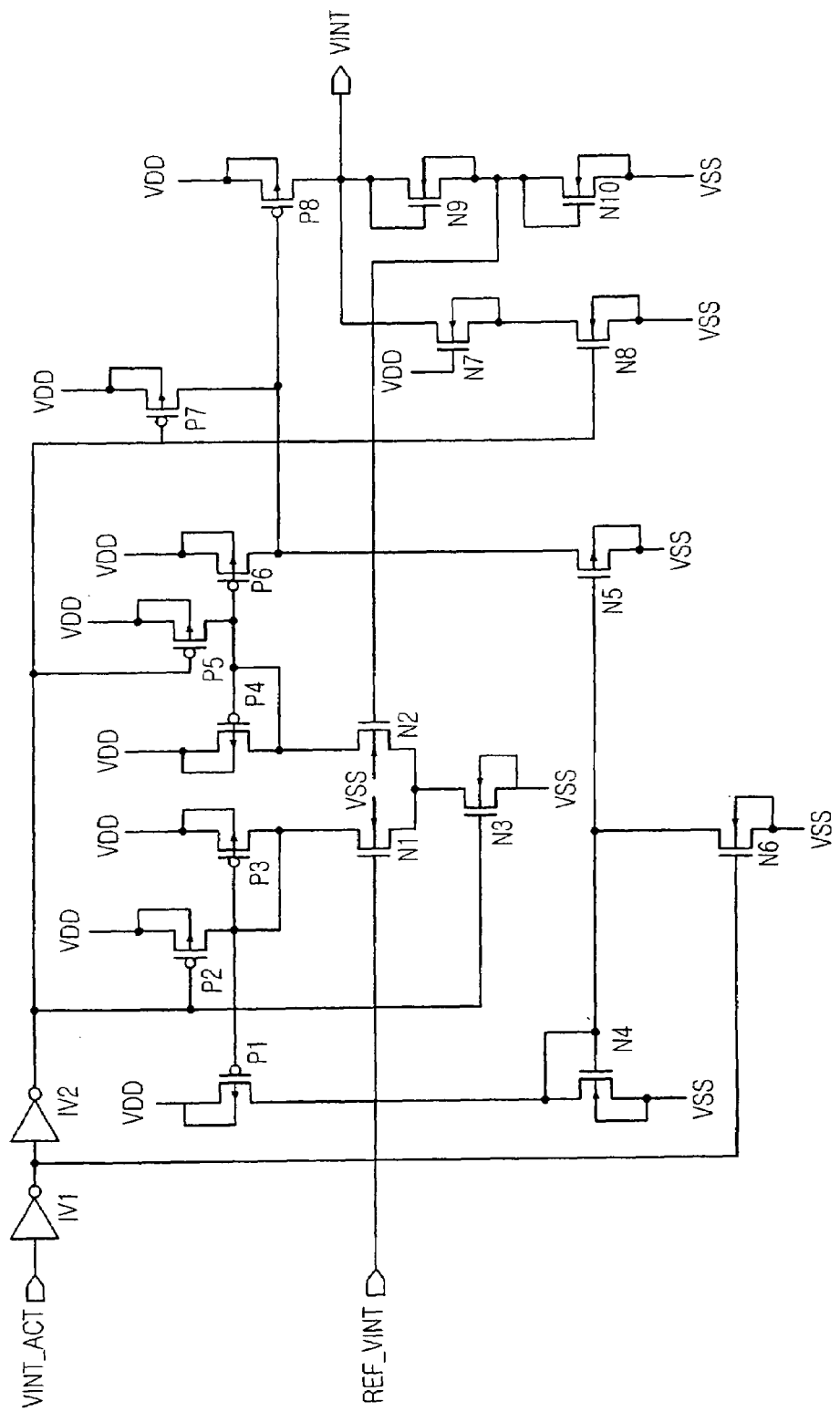
FIG. 8 is a circuit diagram showing a typical active voltage generating unit formed in a semiconductor device.
Figure 9:
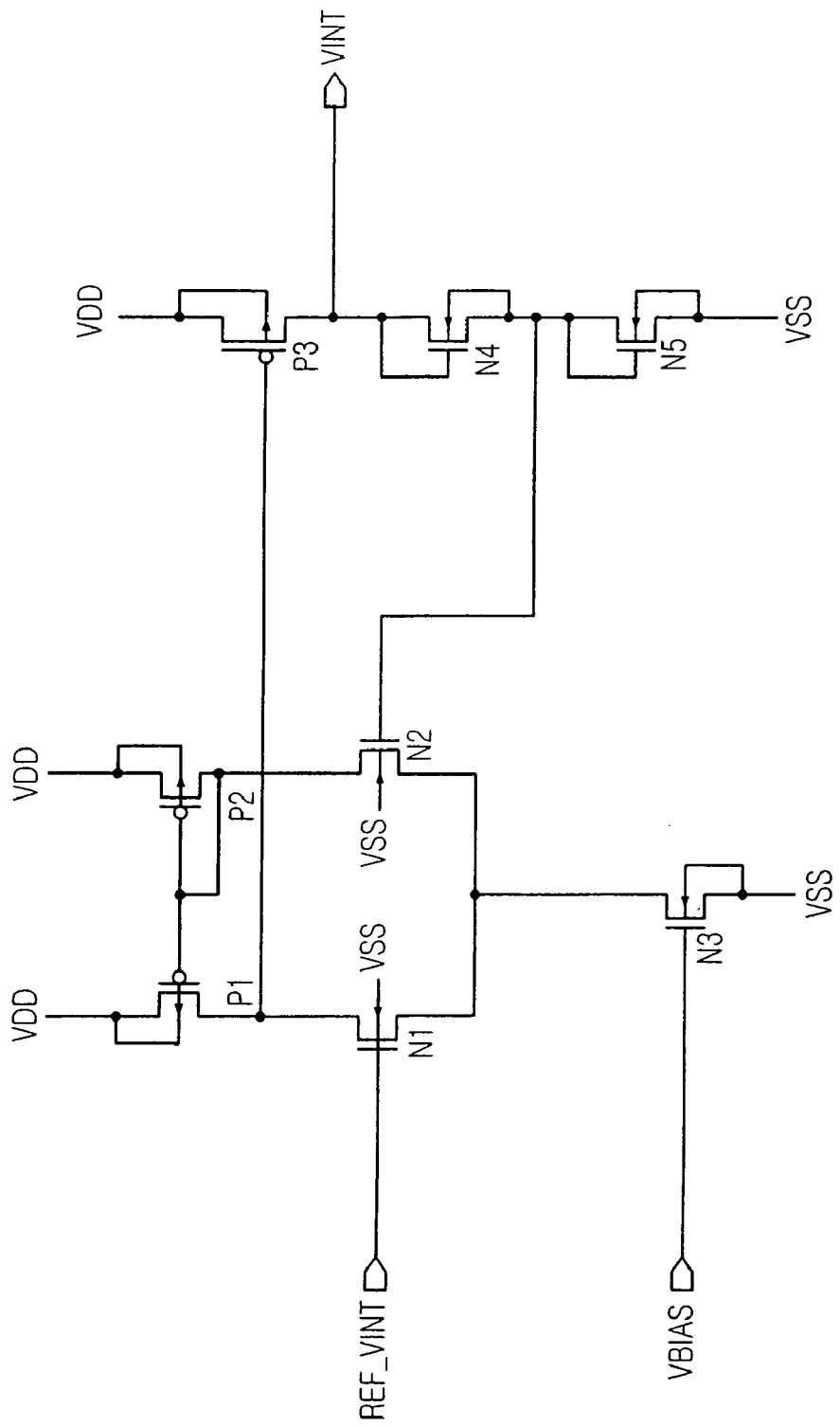
FIG. 9 is a circuit diagram showing a typical standby voltage generating unit formed in a semiconductor device.

FIG. 8 shows an embodiment of the active voltage generating units 500, 700 used in the embodiment shown in FIG. 3 and FIG. 9 shows an embodiment of standby (independent) voltage generating units 600, 800. The active voltage generating units 500, 700 and the standby (independent) voltage generating units 600, 800 may have another typical structure used in the semiconductor device.

Figure 10:
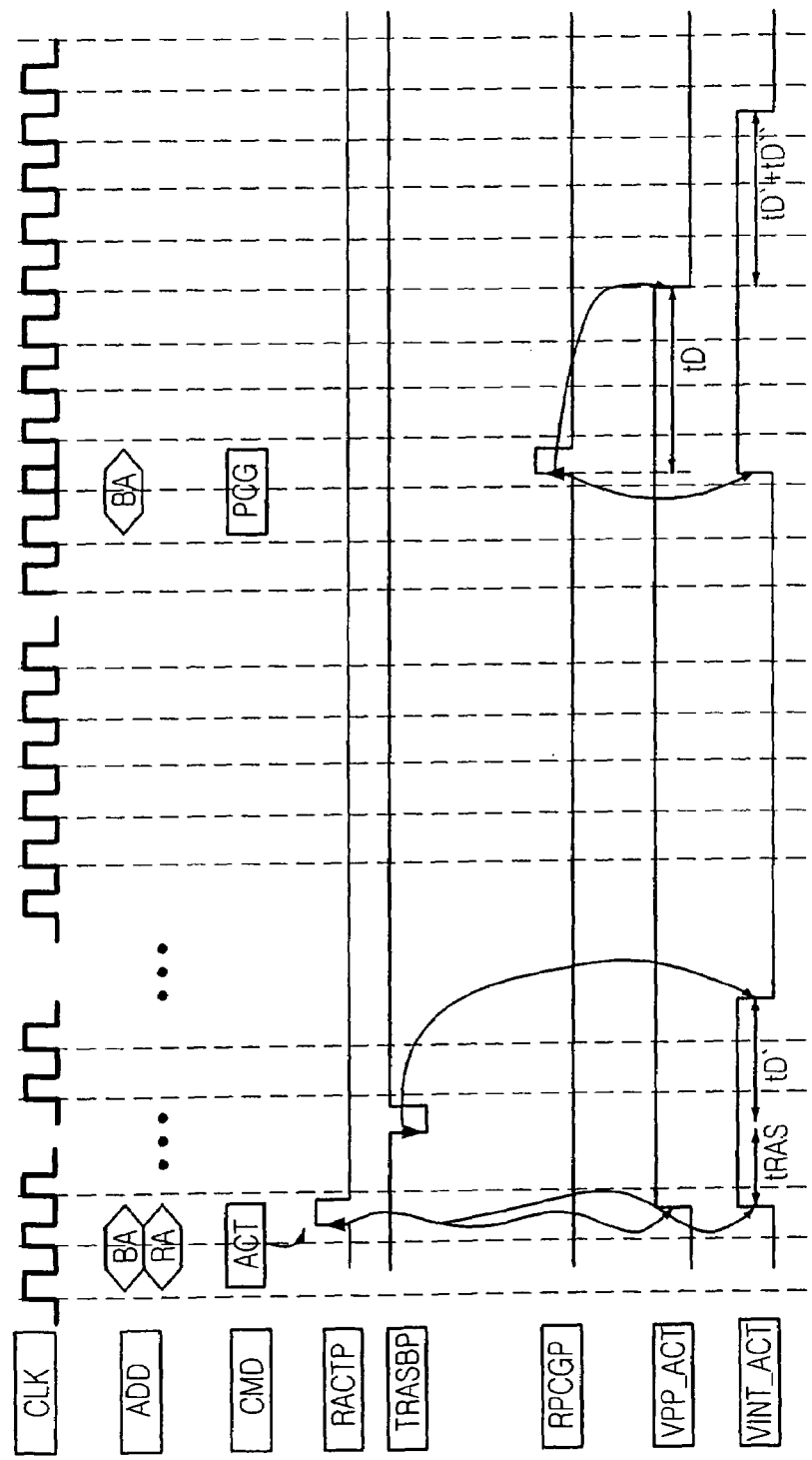
FIG. 10 is a timing diagram of respective signals used in an internal voltage generating circuit shown in FIG. 3.

FIG. 10 is a timing diagram showing generation of the internal power voltage active signal VPP_ACT and the RAS delay signal TRASBP in the embodiment shown in FIG. 3.

A command decoder (not shown) in a memory chip analyzes the external command with using the combination of the external control signals (e.g., CAS, RAS, CS, WE). When the analysis results in an active command ACT for driving the memory device such as a read or write command, the command decoder outputs the row active pulse RACTP to the other elements in the memory chip. The RAS delay (not shown) of the memory chip delays the row active pulse RACTP by a predetermined time to generate the RAS delay signal TRASBP that is activated to low. After sufficient time to perform the read or write operation, the command decoder outputs the row precharge pulse RPCGP as the precharge command CGP.

When the internal power voltage generation controlling unit 300 shown in FIGS. 4 and 5 receives the row active pulse RACTP (particularly, at the rising edge of the RACTP), it activates the internal power voltage active signal VPP_ACT. When the internal power voltage generation controlling unit 300 receives the row precharge pulse RPCGP (particularly, at the rising edge of the RPCGP), it deactivates the internal power voltage active signal VPP_ACT. Since the delaying unit 380 of the internal power voltage generation controlling unit 300 includes a falling edge delay formed with a delay, an inverter and a NAND gate, low transition (deactivation) of the internal power voltage active signal VPP_ACT occurs after a predetermined delay from activation (rising) of the row precharge pulse RPCGP. Accordingly, the power voltage VPP can be supplied for a predetermined time tD required for performing the precharge operation based on the precharge command PCG.

When the core voltage generation controlling unit 400 shown in FIGS. 6 and 7 receives the row active pulse RACTP (particularly, at the rising edge of the RACTP), it activates the core voltage active signal VINT_ACT. The core voltage active signal VINT_ACT is deactivated at activation (the falling edge) of the RAS delay signal TRASBP. Since the delaying unit 480 of the core voltage generation controlling unit 400 includes a falling edge delay formed with a delay, an inverter and a NAND gate, low transition (deactivation) of the core voltage active signal VINT_ACT occurs after a predetermined delay tD' from Activation (the falling edge) of the RAS delay signal TRASBP.

Further, since the enable trigger 440 of the core voltage generation generating unit 400 is also activated with the row precharge pulse RPCGP, the deactivated core voltage active signal VINT_ACT is again activated with the row precharge pulse RACGP. The activated core voltage active signal VINT_ACT is deactivated depending on low transition of the internal power voltage active signal VPP_ACT that is inputted to the disable trigger 420. The low transition of the internal power voltage active signal VPP_ACT is delayed in the falling edge delay (in this case, it is formed with the delay, the inverter and the NOR gate) of the disable trigger 420 by a predetermined time tD". Also, even after low transition of the internal power voltage active signal VPP_ACT is inputted, the low transition of the core voltage active signal VINT_ACT is delayed in the falling edge delay in the delaying unit 480 by the predetermined delay tD'. Accordingly, the low transition of the core voltage active signal VINT_ACT occurs with a delay tD'+tD" from the low transition of the internal power voltage active signal VPP_ACT.

Accordingly, in the semiconductor memory device of the embodiment, the active command ACT is inputted, the internal power voltage active signal VPP_ACT and the core voltage active signal VINT_ACT are transited to the activated state to simultaneously activate the internal power voltage generating unit and the core voltage generating unit, as shown in FIG. 10. After sufficient time for performing the operation for the active command, the RAS delay signal TRASBP is generated (transited to low) and, subsequently, the core voltage active signal VINT_ACT is transited to the deactivated state so as to deactivate the core voltage generating unit.

If the precharge command is inputted in this state, the core voltage active signal VINT_ACT is again transited to the activated state, the internal power voltage active signal VPP_ACT is transited to the deactivated state after a predetermined delay tD of the delaying unit 380 of the internal power voltage generation controlling unit 300. After the internal power voltage active signal VPP_ACT is transited, the core voltage active signal VINT_ACT is transited to deactivated state after the predetermined delay tD'+tD" of the disable trigger 420 and the delaying unit 480 of the core voltage generation controlling unit 400.

While the present invention has been described with respect to the particular embodiments, it will be apparent to those skilled in the art that various changes and modifications may be made without departing from the spirit and scope of the invention as defined in the following claims.

For example, the present embodiment applies the spirit of the present invention to a semiconductor memory device using a row active pulse as an active signal and a row precharge active pulse as a precharge signal. It will be apparent to those skilled in the art to apply the spirit of the present invention to a semiconductor memory device, in which the active/precharge signal is not in the form of a pulse but a simple transition signal, with modifications of the embodiment.

As described above, the semiconductor memory device including the internal voltage generating circuit according to the present invention maintains the internal power voltage active signal VPP_ACT from row active point to row precharge point and maintains the core voltage active signal VINT_ACT for a predetermined time from row active point and for a predetermined from row precharge point. Therefore, since the internal power voltage generating unit having a separate voltage detector does not give control signal such as an enable signal and a disable signal too frequently, the quality of the internal power voltage can be maintained. Further the core voltage generating unit with no separate voltage detector is enabled only if power is required, so as to reduce unnecessary power consumption.

The core voltage generating unit in the internal voltage generating circuit according to the present invention disables the core voltage active signal VINT_ACT after a predetermined delay from disablement of the internal power voltage active signal VPP_ACT. Accordingly, the core voltage can be supplied for a sufficient time after generation of the row precharge pulse and the internal power voltage can be supplied for a required time so that power consumption due to supply of unnecessary internal power voltage can be reduced and instability due to insufficient supply of the core voltage can be prevented.

The present application contains subject matter related to the Korean patent application No. KR 2004-87674, filed in the Korean Patent Office on Oct. 30, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device comprising:
   a command decoder for receiving external control signals to generate an active signal and a precharge signal; and
   an internal voltage generating means for generating an internal power voltage and a core voltage by using the active signal and the precharge signal, wherein a timing of activating the internal power voltage is different from that of activating the core voltage based on the active signal and the precharge signal.

2. A semiconductor memory device comprising:
   a command decoder receiving external control signals to output an active signal and a precharge signal;
   a first internal voltage generation controlling means receiving the active signal and the precharge signal for activating a first internal voltage active signal for a predetermined time;
   a second internal voltage generation controlling means receiving the active signal, the precharge signal and the first internal voltage active signal for activating a second internal voltage active signal for a predetermined time;
   a first internal voltage generating means for generating a first internal voltage during the activation period of the first internal voltage active signal; and
   a second internal voltage generating means for generating a second internal voltage during the activation period of the second internal voltage active signal.

3. The semiconductor memory device as recited in claim 2, further comprising a first independent internal voltage generating means for generating a first internal voltage regardless of the first internal voltage active signal.

4. The semiconductor memory device as recited in claim 2, further comprising a second independent internal voltage generating means for generating a second internal voltage regardless of the second internal voltage active signal.

5. The semiconductor memory device as recited in claim 2, wherein the first internal voltage generation controlling means activates the first internal voltage active signal when the active signal is activated, and deactivates the first internal voltage active signal after delaying a predetermined time from activation of the precharge signal.

6. The semiconductor memory device as recited in claim 2, wherein the first internal voltage generation controlling means includes:
   an enable trigger receiving the active signal for transiting the first internal voltage active signal to activated state;
   a disable trigger receiving the precharge signal for transiting the first internal voltage active signal to deactivated state; and
   a latching/delaying unit for delaying the results of the enable trigger or the disable trigger by a predetermined time to output the first internal voltage active signal.

7. The semiconductor memory device as recited in claim 6, wherein the latching/delaying unit includes a falling edge delaying means for delaying falling edge of an input signal by a predetermined time.

8. The semiconductor memory device as recited in claim 2, wherein the second internal voltage generation controlling means activates the second internal voltage active signal when the active signal is activated, deactivates the second internal voltage active signal after delaying a predetermined time from activation of the active signal, reactivates the second internal voltage active signal when the precharge signal is activated, and deactivates the second internal voltage active signal after delaying a predetermined time from deactivation of the first internal voltage active signal.

9. The semiconductor memory device as recited in claim 2, wherein the second internal voltage generation controlling means includes:
   an enable trigger receiving the active signal and the precharge signal for transiting the second internal voltage active signal to activated state;
   a disable trigger receiving the first internal voltage active signal for transiting the second internal voltage active signal to deactivated state; and
   a latching/delaying unit for delaying the results of the enable trigger or the disable trigger by a predetermined time to output the second internal voltage active signal.

10. The semiconductor memory device as recited in claim 9, wherein the latching/delaying unit includes a falling edge delaying means for delaying falling edge of an input signal by a predetermined time.

11. The semiconductor memory device as recited in claim 9, further comprising a RAS delaying means for outputting a RAS delay signal that is activated to low after a predetermined delay time from activation of the active signal.

12. The semiconductor memory device as recited in claim 11, wherein the disable trigger receives the RAS delay signal to transit the second internal voltage active signal to deactivated state.

13. The semiconductor memory device as recited in one of claim 2, wherein the first internal voltage is an internal power voltage.

14. The semiconductor memory device as recited in one of claim 2, wherein the second internal voltage is a core power voltage.

15. The semiconductor memory device as recited in one of claim 2, wherein the active signal is a pulse of high activation.

16. The semiconductor memory device as recited in one of claim 2, wherein the precharge signal is a pulse of high activation.

17. An internal voltage generating method comprising the steps of:
   (a) activating a first internal voltage generating means and a second internal voltage generating means depending on an active command;
   (b) deactivating the second internal voltage generating means after a predetermined time from the active command;
   (c) reactivating the second internal voltage generating means depending on a precharge command;

(d) deactivating the first internal voltage generating means after a predetermined time from the precharge command; and
(e) deactivating the second internal voltage generating means after a predetermined time from deactivation of the first internal voltage generating means.

18. The internal voltage generating method as recited in claim 17, wherein the first internal voltage is an internal power voltage.

19. The internal voltage generating method as recited in claim 17, wherein the second internal voltage is a core voltage.

20. The internal voltage generating method as recited in one of claim 19, wherein the step (b) is performed based on a RAS delay signal that is enabled after a predetermined from the active command.

* * * * *